US008625055B2

(12) United States Patent
Song et al.

(10) Patent No.: US 8,625,055 B2
(45) Date of Patent: Jan. 7, 2014

(54) ORGANIC LIGHT EMITTING DISPLAY DEVICE

(75) Inventors: Hyung-Jun Song, Yongin (KR); Jong-Hyuk Lee, Yongin (KR); Chang-Ho Lee, Yongin (KR); Il-Soo Oh, Yongin (KR); Hee-Jo Ko, Yongin (KR); Si-Jin Cho, Yongin (KR); Jin-Young Yun, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 203 days.

(21) Appl. No.: 13/064,561

(22) Filed: Mar. 31, 2011

(65) Prior Publication Data

US 2011/0249211 A1    Oct. 13, 2011

(30) Foreign Application Priority Data

Apr. 1, 2010    (KR) .................. 10-2010-0029991

(51) Int. Cl.
G02F 1/1333    (2006.01)
G02F 1/1335    (2006.01)

(52) U.S. Cl.
USPC ............................................. 349/88; 349/69

(58) Field of Classification Search
USPC ................... 349/69–71, 88, 90, 74
See application file for complete search history.

(56) References Cited

U.S. PATENT DOCUMENTS 4,685,771 A    8/1987 West et al.
6,842,170 B1 *  1/2005 Akins et al. .................. 345/173

2008/0258614 A1*  10/2008  Ha et al. .......................... 313/504
2009/0135319 A1    5/2009  Veerasamy
2010/0171905 A1*  7/2010  Huang et al. ..................... 349/69

FOREIGN PATENT DOCUMENTS

| JP | 2006-276089 A | 10/2006 |
| JP | 2008-112112 A | 5/2008 |
| KR | 10 2009-0034109 A | 4/2009 |
| KR | 10 2009-0100920 A | 9/2009 |

OTHER PUBLICATIONS

Korean Office Action in KR 10-2010-0029991, dated Jul. 27, 2011 (Song, et al.).
Korean Notice of Allowance dated Sep. 5, 2013.

* cited by examiner

Primary Examiner — Jessica M Merlin
(74) Attorney, Agent, or Firm — Lee & Morse, P.C.

(57) ABSTRACT

An organic light emitting display device includes a substrate having a transmitting region interposed between pixel regions; thin film transistors on a first surface of the substrate; a passivation layer covering the thin film transistors; pixel electrodes on the passivation layer; an opposite electrode disposed to face the pixel electrodes; an organic emission layer between the pixel electrodes and the opposite electrode; a polymer dispersed liquid crystal (PDLC) device disposed such that the thin film transistors are between the PDLC device and the passivation layer, the PDLC device having: a first electrode; a second electrode; and a PDLC layer in which liquid crystal is dispersed in polymer matrix. Distortion of images transmitted through the organic light emitting display device is prevented by restricting scattering of the transmitted light, the transmission of the external light may be adjusted simply, and degradation of the brightness and color coordinate reproduction may be prevented.

20 Claims, 12 Drawing Sheets

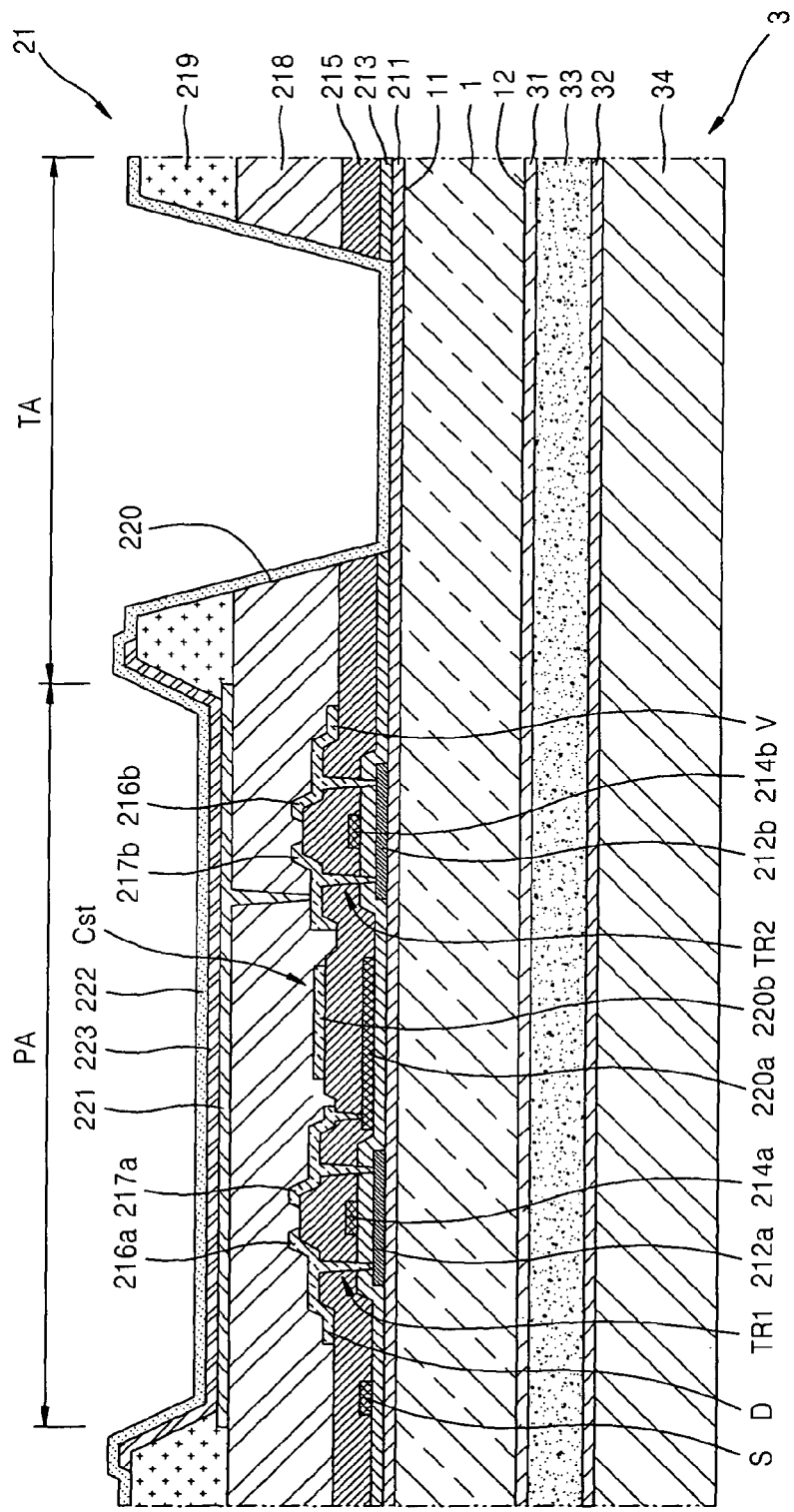

ORGANIC LIGHT EMITTING DISPLAY DEVICE

CROSS-REFERENCE TO RELATED APPLICATION

This application claims the benefit of Korean Patent Application No. 10-2010-0029991, filed Apr. 1, 2010 in the Korean Intellectual Property Office, the disclosure of which is incorporated herein by reference.

BACKGROUND

1. Field

Aspects of the present invention relate to an organic light emitting display device, and more particularly, to a transparent organic light emitting display device.

2. Description of the Related Art

Organic light emitting display devices generally have wide viewing angles, high contrast ratios, short response times, and reduced power consumption, and thus may be used across a variety of applications such as personal portable devices, such as MP3 players and mobile phones, or large screen displays, such as television sets. An organic light emitting display device has self-emitting characteristics, and a weight and a thickness of the organic light emitting display device can be reduced since the organic light emitting display device does not require an additional light source, compared to a liquid crystal display device. Also, an organic light emitting display device can be manufactured as a transparent display device by including transparent thin film transistors and transparent organic light emitting devices.

In a transparent display device, when the device is in an off-state, an object or an image positioned on a side of the device opposite to a user is visible to the user through organic light emitting diodes and through spaces between patterns of thin film transistors and various wires. Therefore, a distorted image is transmitted to the user due to the patterns. The reason for this is because gaps between the patterns are merely a few nanometers in size. That is, the widths are almost equal to the wavelengths of visible light, thus causing light to scatter as it passed through the transparent display device.

In addition, external light is incident to a surface that is opposite to the surface displaying images while the images are displayed on the transparent display device, and thus, image quality is degraded due to the external light. Also, light displaying images and the transmitted external light are mixed, and thus, expected brightness and color coordinates may not be displayed well.

SUMMARY

Aspects of the present invention provide a transparent organic light emitting display device that can prevent distortion of an image transmitted therethrough by preventing light scattering during image display.

Aspects of the present invention also provide a transparent organic light emitting display device that can adjust transmission of external light simply.

Aspects of the present invention also provide an organic light emitting display device that can prevent degradation of brightness and color coordinate reproduction due to the external light that is transmitted through the organic light emitting display device during image display.

According to an aspect of the present invention, there is provided an organic light emitting display device including: a substrate having a transmitting region and pixel regions, adjacent pairs of the pixel regions being separated from each other by a corresponding portion of the transmitting region interposed between the pixel regions; thin film transistors formed on a first surface of the substrate in respective ones of the pixel regions; a passivation layer covering the thin film transistors; pixel electrodes disposed on the passivation layer; an opposite electrode disposed to face the pixel electrodes and configured to transmit light; an organic emission layer disposed between the pixel electrodes and the opposite electrode and configured to emit light; and a polymer dispersed liquid crystal (PDLC) device and disposed such that the thin film transistors are between the PDLC device and the passivation layer and disposed in an area corresponding to at least the transmitting region, the PDLC device comprising: a first electrode; a second electrode; and a PDLC layer having liquid crystal dispersed in polymer matrix, wherein voltages of different polarities are applied to the first electrode and the second electrode, respectively, to form an electric field, wherein the PDLC device is insulated from the thin film transistors, wherein each of the pixel electrodes is electrically connected to and formed substantially directly above the corresponding thin film transistor, wherein each of the pixel electrodes is formed only in the corresponding pixel region, and wherein the pixel electrodes are separated from each other.

According to another aspect of the present invention, there is provided an organic light emitting display device including: a substrate having a transmitting region and pixel regions, adjacent pairs of the pixel regions being separated from each other by a corresponding portion of the transmitting region interposed between the pixel regions; pixel circuit units disposed in respective ones of the pixel regions over a first surface of the substrate, wherein each of the pixel circuit units comprises at least one thin film transistor; a first insulating film covering the pixel circuit unit; pixel electrodes disposed on the first insulating film; an opposite electrode disposed to face the pixel electrodes and configured to transmit light; an organic emission layer disposed between the pixel electrodes and the opposite electrode and configured to emit light; and a polymer dispersed liquid crystal (PDLC) device disposed such that the thin film transistor is between the PDLC device and the first insulating film and disposed in an area corresponding to at least the transmitting region, the PDLC device comprising: a first electrode; a second electrode; and a PDLC layer in which liquid crystal is dispersed in polymer matrix, wherein voltages of different polarities are applied to the first electrode and the second electrode, respectively, to form an electric field, wherein the PDLC device is insulated from the thin film transistor, wherein each of the pixel electrodes is electrically connected to and formed substantially directly above the corresponding pixel circuit unit, and wherein the pixel electrodes are separated from each other and formed only in the pixel regions.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which:

FIG. 13 is a cross-sectional view of an organic light emitting display device according to an embodiment of the present invention.

DETAILED DESCRIPTION

Figure 1:
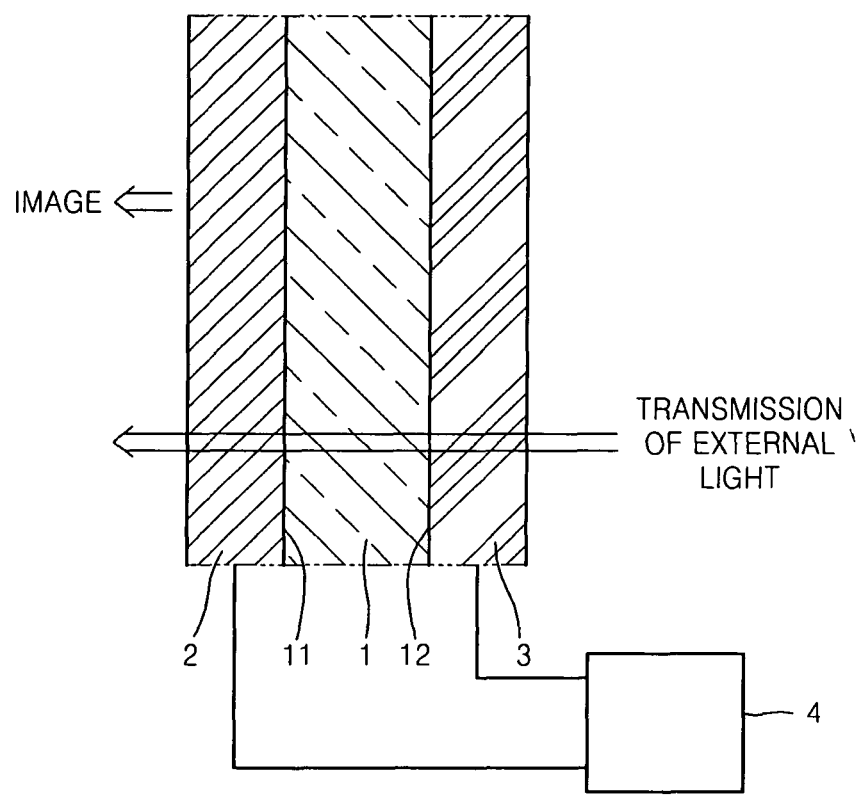
FIG. 1 is a cross-sectional view of an organic light emitting display device according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

FIG. 1 is a cross-sectional view of an organic light emitting display device according to an embodiment of the present invention. Referring to FIG. 1, in the organic light emitting display device, a display unit 2 is disposed on a first surface 11 of a first substrate 1 and a polymer-dispersed liquid crystal (PDLC) device 3 is disposed on a second surface 12 of the first substrate 1. The substrate 1 is formed of a transparent material, such as a transparent glass or a transparent plastic. The first surface 11 and the second surface 12 face each other. The first substrate 1 may not be a single substrate in all aspects. For example, the first substrate 1 may be at least two substrates attached to each other in other embodiments. For example, a substrate having the first surface 11 on which the display unit 21 is formed and a substrate having the second surface 12 on which the PDLC device 3 is formed may be bonded to each other to form the first substrate 1.

In the organic light emitting display device, external light is incident from an outer portion of the PDLC device 3 and passes through the PDLC device 3, the first substrate 1, and the display unit 2. As will be described later, the display unit 2 is formed to transmit external light. For example, referring to FIG. 1, the display unit 2 is formed so that a user positioned on a side where an image is displayed can observe the external image transmitted through the PDLC device 3, the first substrate 1, and the display unit 2. While not required in all aspects, in the shown organic light emitting display device, the display unit 2 and the PDLC device 3 are connected to an additional controller 4. While not required in all aspects, the controller 4 can be implemented using one or more general or special purpose processors executing software and/or firmware to implement control operations for the device.

Figure 2:
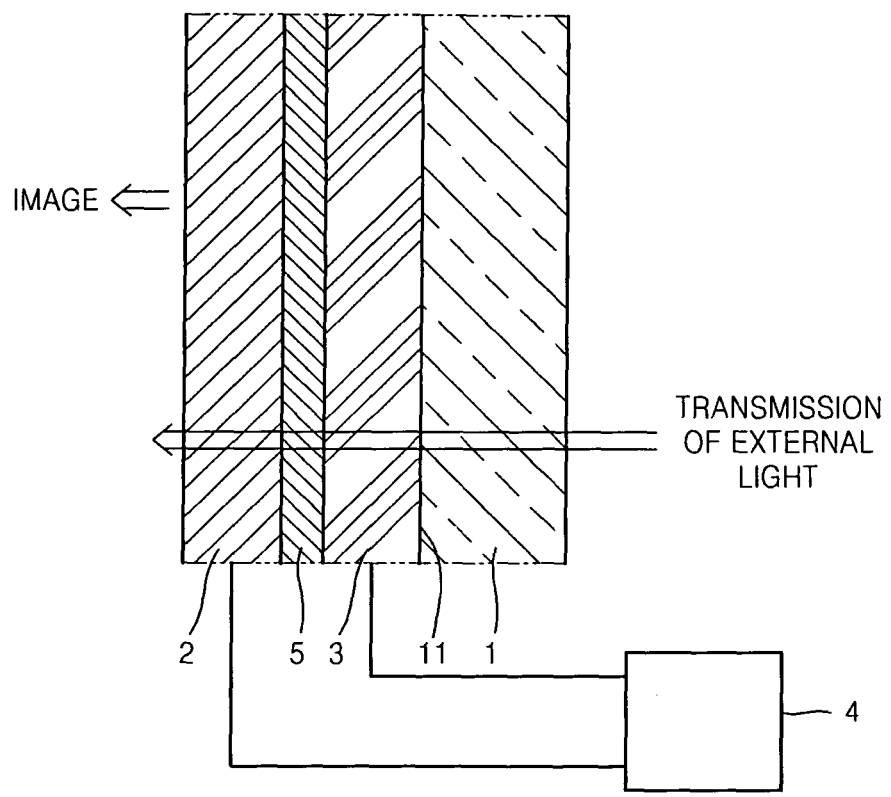
FIG. 2 is a cross-sectional view of an organic light emitting display device according to another embodiment of the present invention.

As shown in the embodiment in FIG. 2, the PDLC device 3 is formed on the first surface 11 of the first substrate 1. An insulating layer 5 is formed on the PDLC device 3. The display unit 2 is formed on the insulating layer 5. Hereinafter, embodiments of the present invention will be described based on the organic light emitting display device shown in FIG. 1, however, embodiments that will be described later may be applied to the example shown in FIG. 2.

Figure 3:
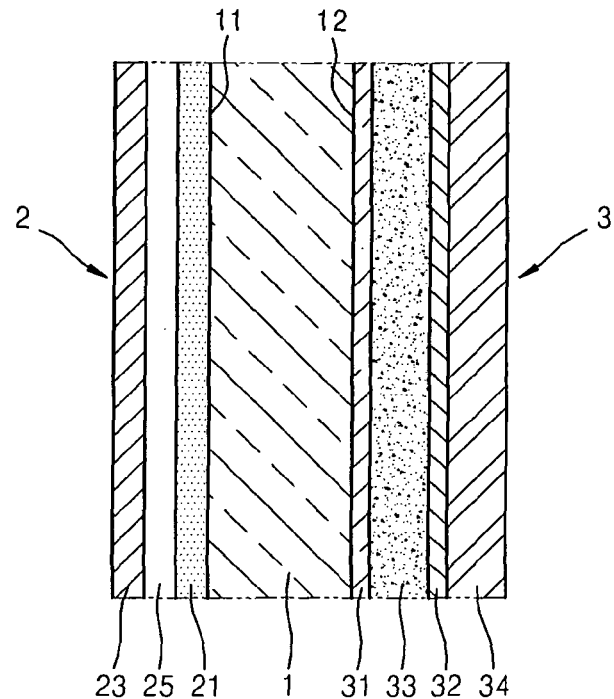
FIG. 3 is a cross-sectional view showing details of another embodiment of the organic light emitting display device of FIG. 1.

FIG. 3 is a cross-sectional view showing an embodiment of the organic light emitting display device of FIG. 1. The display unit 2 includes an organic emission unit 21 disposed on the first surface 11 of the first substrate 1 and a sealing substrate 23 to seal the organic emission unit 21. The sealing substrate 23 is formed of a transparent material to allow viewing of an image generated by the organic emission unit 21 and to prevent external air and moisture from penetrating into the organic emission unit 21. Edges of the sealing substrate 23 and the organic emission unit 21 are sealed by a sealant (not shown), and thus, a space 25 is formed between the sealing substrate 23 and the organic emission unit 21. The space 25 may be filled with an absorbent or a filler, but the invention is not limited thereto.

Figure 4:
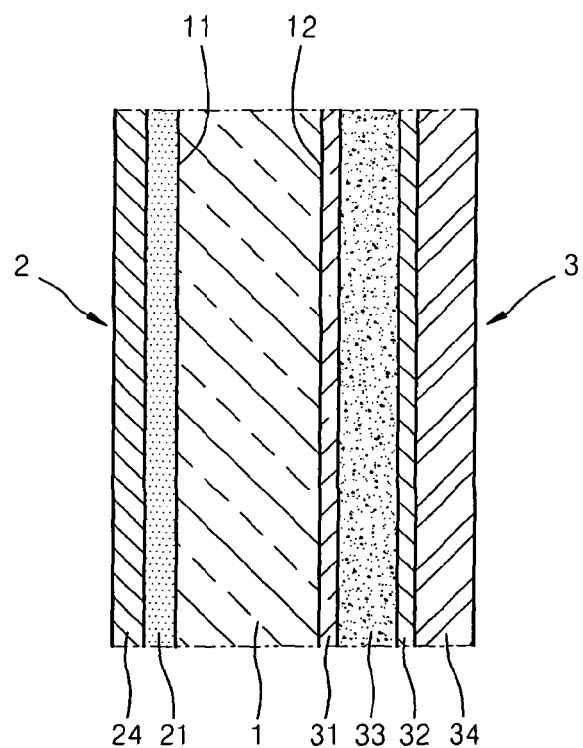
FIG. 4 is a cross-sectional view showing details of an embodiment of the organic light emitting display device of FIG. 1.

FIG. 4 is a cross-sectional view showing another embodiment of the organic light emitting display device of FIG. 1. As shown in FIG. 4, a thin sealing film 24 is formed on the organic emission unit 21 to protect the organic emission unit 21 from the environment. The thin sealing film 24 has a structure in which a film formed of an inorganic material, such as silicon oxide or silicon nitride, and a film formed of an organic material, such as epoxy or polyimide, are alternately stacked. The thin sealing film 24 may have a structure of a variety of thin film type sealing structures.

With reference to FIGS. 3 and 4, the PDLC device 3 includes a first electrode 31 formed on a second surface 12 of the first substrate 1, a second electrode 32 facing the first electrode 31, and a PDLC layer 33 disposed between the first and second electrodes 31 and 32. The second electrode 32 is formed on a second substrate 34, and the second substrate 34 is attached to the first substrate 1 via an additional sealant (not shown). The first and second electrodes 31 and 32 are transparent electrodes respectively formed of a material such as indium tin oxide (ITO), indium zinc oxide (IZO), $In_2O_3$, or ZnO. However, aspects of the present invention are not limited thereto, and the first and second electrodes 31 and 32 may be formed of other suitable materials.

The PDLC layer 33 is formed of polymer dispersed liquid crystal. That is, the PDLC layer 33 includes liquid crystal droplets of a diameter of about 1 to 2 μm which are dispersed in polymer matrix. Here, since liquid crystal molecules are dispersed in the polymer matrix, the non-directional liquid crystal molecules may scatter the incident light. Therefore, when a predetermined voltage is applied to the first and second electrodes 31 and 32, the liquid crystal molecules are arranged in a direction of an electric field due to a strong electric field of the applied voltage. At this time, the liquid crystal molecules disperse less light, and thus, more of the external light is transmitted through the PDLC device 3. However, when the voltage is not applied to the first and second electrodes 31 and 32, the light is strongly scattered by the liquid crystal droplets and the light does not transmit through the PDLC device 3. However, aspects of the present invention are not limited to the PDLC device 3 of the above example. For example, the first and second electrodes 31 and 32 may be arranged in parallel with each other to form a horizontal electric field like a liquid crystal display device of a horizontal electric field mode.

The PDLC device 3 may realize a see-through display by transmitting the external light when the predetermined voltage is applied between the first and second electrodes 31 and 32. In addition, when the predetermined voltage is not applied between the first and second electrodes 31 and 32, the PDLC device 3 does not transmit the external light, and thus provides clear images and high contrast ratio. The PDLC device 3 may be operated automatically or manually by the controller 4 shown in FIGS. 1 and 2.

Figure 5:
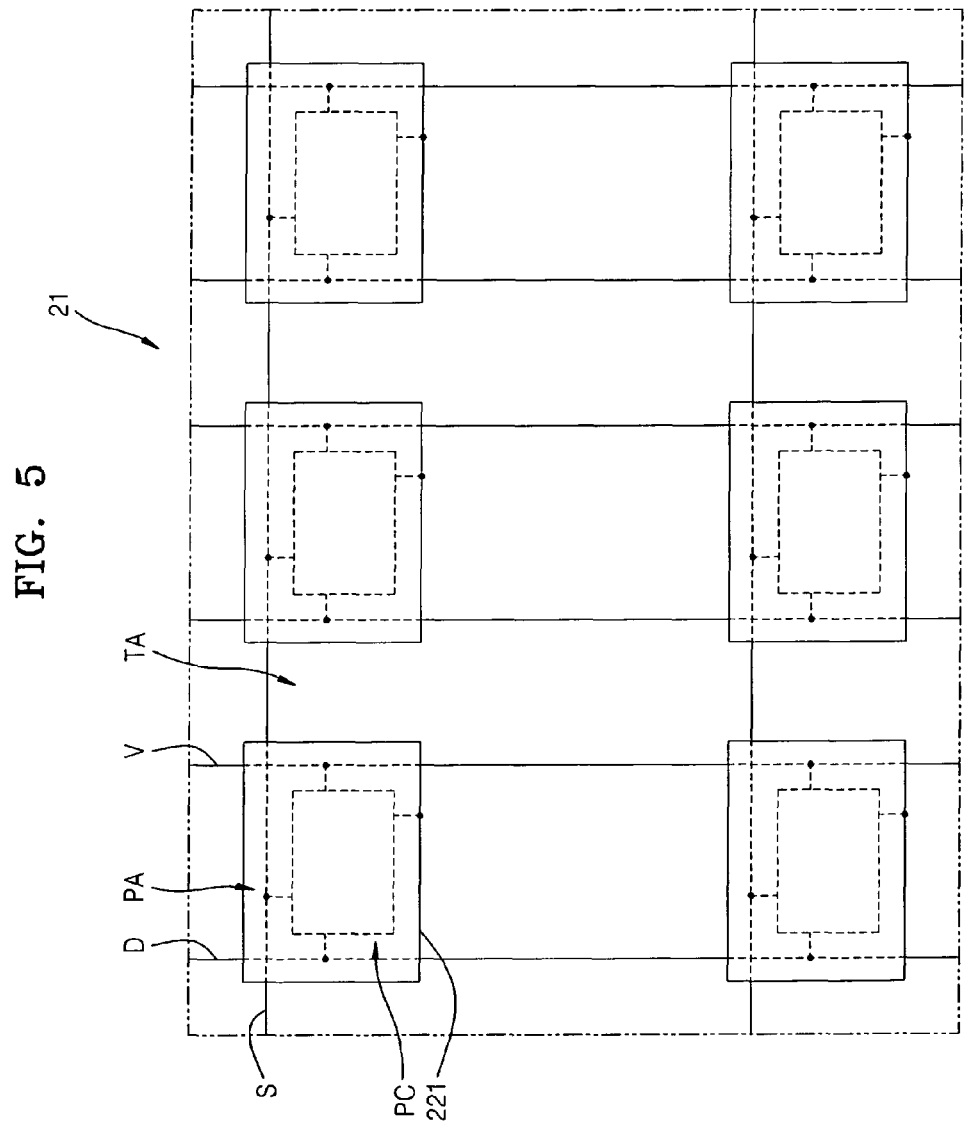
FIG. 5 is a schematic drawing showing an example of the organic emission unit of FIG. 2 or FIG. 3.

FIG. 5 is a schematic drawing showing an example of the organic emission unit 21 of FIG. 3 or FIG. 4. Referring to FIGS. 3 through 5, according to an embodiment of the present invention, the organic emission unit 21 is disposed on the first substrate 1 having a transmitting region TA transmitting external light and pixel regions PA. The pixel regions PA are separated from each other with the transmitting region TA interposed therebetween. Each of the pixel regions PA includes a pixel circuit unit PC, and conductive lines, such as a scan line S, a data line D, and a driving power line V, which are electrically connected to the pixel circuit unit PC. Although not shown, various other conductive lines besides the scan line S, the data line D, and the driving power line V may further be connected to the pixel circuit unit PC according to the configuration of the pixel circuit unit PC. A pixel electrode 221 is disposed on the pixel circuit unit PC.

Figure 6:
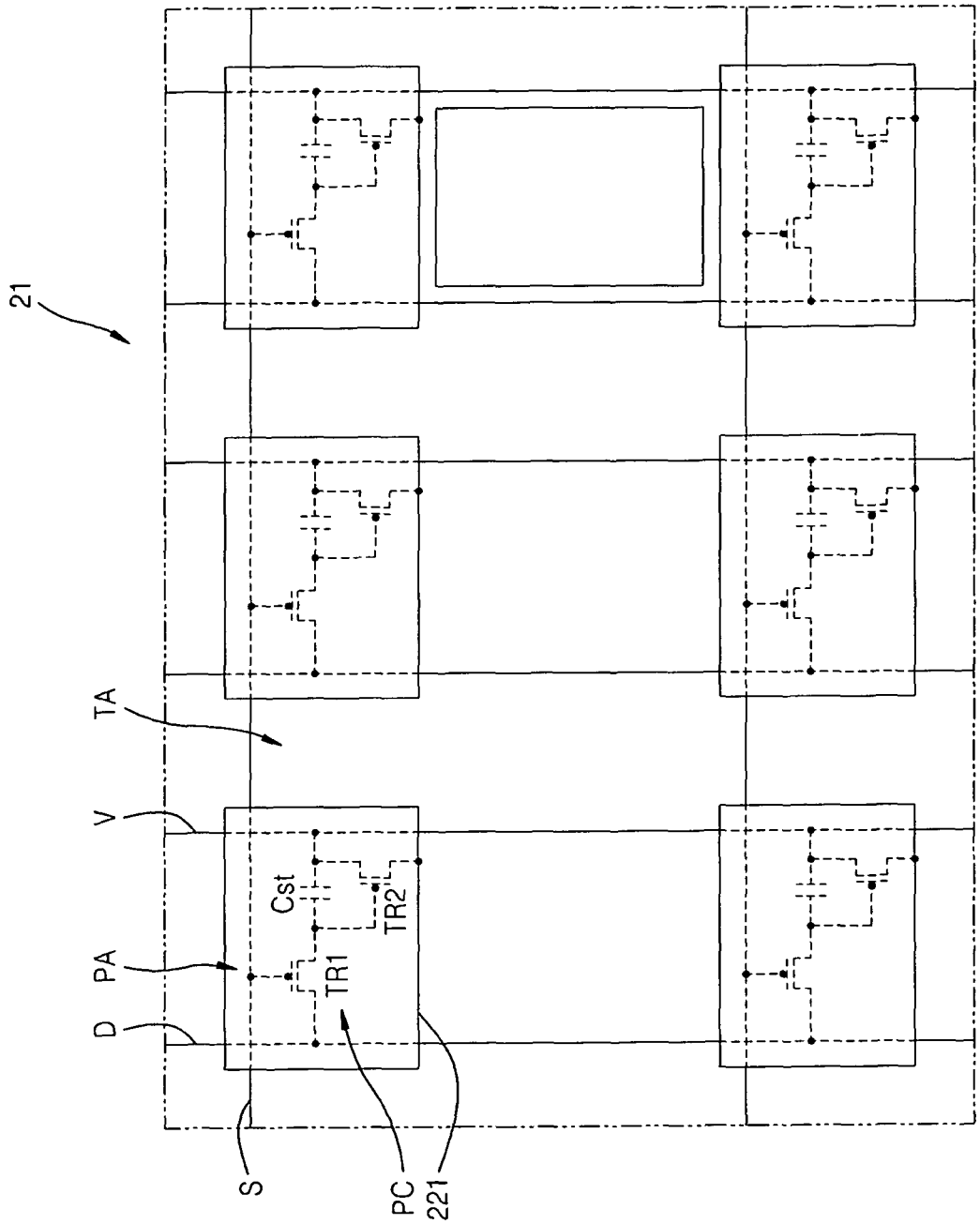
FIG. 6 is a schematic drawing of the organic emission unit including an example of a pixel circuit unit of FIG. 5.

FIG. 6 shows an example of the pixel circuit unit PC. The shown pixel circuit unit PC includes a first thin film transistor TR1 connected to the scan line S and the data line D. A second thin film transistor TR2 is connected to the first thin film transistor TR1 and the driving power line V. A capacitor Cst is connected to the first and second thin film transistors TR1 and TR2. In one embodiment, the first thin film transistor TR1 may be a switching transistor and the second thin film transistor TR2 may be a driving transistor. The second thin film transistor TR2 is electrically connected to the pixel electrode 221. In FIG. 6, the first and second thin film transistors TR1 and TR2 are P-type transistors. However, aspects of the present invention are not limited thereto, and at least one of the first and second thin film transistors TR1 and TR2 may be an N-type transistor.

According to an embodiment of the present invention, as illustrated in FIGS. 5 and 6, all the conductive lines, including scan line S, data line D, and driving power line V, are disposed to cross the pixel region PA. Thus, no conductive lines cross the transmitting regions TA. As described above, if other conductive lines besides the scan line S, data line D, and driving power line V are further formed, the other conductive lines are also disposed to cross the pixel region PA and to not cross the transmitting regions TA.

Each of the pixel regions PA is a light emitting region. The pixel circuit unit PC is located in the light emitting region and the conductive lines, including scan line S, data line D, and driving power line V, cross the light emitting region. Thus, the user may only perceive regions from which the light is emitted and may see the external portion through the transmitting region TA. In addition, when external light is transmitted through the pixel circuit unit PC, the external light is scattered by patterns of the devices in the pixel circuit unit PC, and thus, distortion of the external image may be prevented. Therefore, solar light can be prevented from scattering caused by interfering with the patterns of internal devices of the pixel circuit unit PC, thereby preventing external image distortion.

In one embodiment, at least one of the conductive lines, including scan line S, data line D, and driving power line V, is disposed to cross the transmitting region TA between the pixel regions PA. However, since the conductive lines are formed to be very thin, the conductive lines are hardly visible to the user and have little effect on the overall transmittance of the organic emission unit 21, and accordingly, a see-through display can be realized. Also, although the user may not see the external image as much in regions covered by the pixel regions PA, in consideration of the overall display region, there is little effect on observing the external image since the pixel regions PA may be viewed by the user as a plurality of dots regularly arranged on a surface of a transparent glass.

In an embodiment of the present invention, the transmitting regions TA and the pixel regions PA are formed so that a ratio of the area of the transmitting regions TA with respect to the combined area of the transmitting regions TA and the pixel regions PA, is between about 20% and about 90%. In other words, a combined area is the area of the transmitting regions TA plus the area of the pixel regions PA, and the transmitting regions TA are 20% to 90% of the combined area.

The above ratio range may provide an optimal balance between the prevention of light scattering and pixel integrity to provide a stable image. For example, if the ratio is greater than or equal to about 20%, the transparency of the device is enhanced. The ratio of the area of the transmitting regions TA with respect to the overall area of the transmitting regions TA and the pixel regions PA may be approximately 20%. In such an embodiment, the pixel regions PA are present in an island state with respect to the transmitting regions TA, and scattering of external light is minimized since all conductive patterns are disposed across the pixel regions PA. Thus, the display unit 2 may be recognized as a transparent display unit by the user. As will be described later, when a transistor included in the pixel circuit unit PC is formed of a transparent thin film transistor (TFT) such as an oxide semiconductor, and an organic light emitting device is a transparent device, then the display unit 2 may be recognized as a transparent display unit. In this case, unlike a conventional transparent display unit, all conductive patterns are disposed across the pixel regions PA if possible. Accordingly, scattering of external light can be prevented, and transmittance of the external light is high, and thus, the user can see an undistorted external image.

If the ratio of the area of the transmitting regions TA with respect to the entire area of the pixel regions PA and the transmitting regions TA is greater than 90%, pixel integrity of the display unit 2 is excessively reduced, and thus, a stable image is not easily realized through the light emission from the pixel regions PA. In one embodiment, as the area of the pixel regions PA is reduced, the amount of light emitted from the organic light emitting film 223 is increased in order to realize an image. However, if the organic light emitting device is operated so as to emit light having a high intensity, the lifetime of the organic light emitting device is rapidly reduced. Also, when the ratio of the area of the transmitting regions TA with respect to the combine area of the pixel regions PA and the transmitting regions TA is greater than 90% while the size of a single pixel region PA is maintained at an appropriate size, the number of pixel regions PA is reduced. Accordingly, the resolution of the organic light emitting device is reduced.

The ratio of the area of the transmitting regions TA with respect to the combined area of the pixel regions PA and the transmitting regions TA may further be in a range of about 40% to about 70%. This ratio range, about 40% to about 70%, provides advantages. For example, the ratio range of being greater than or equal to about 40% may not significantly limit the user's capability of observing an external image through the transmitting regions TA. Further, the ratio range of being less than or equal to about 70% may make it easier to design the pixel circuit unit PC. However, aspects of the present invention are not limited thereto, and ratio ranges other than the above-described ranges can be used.

Figure 7:
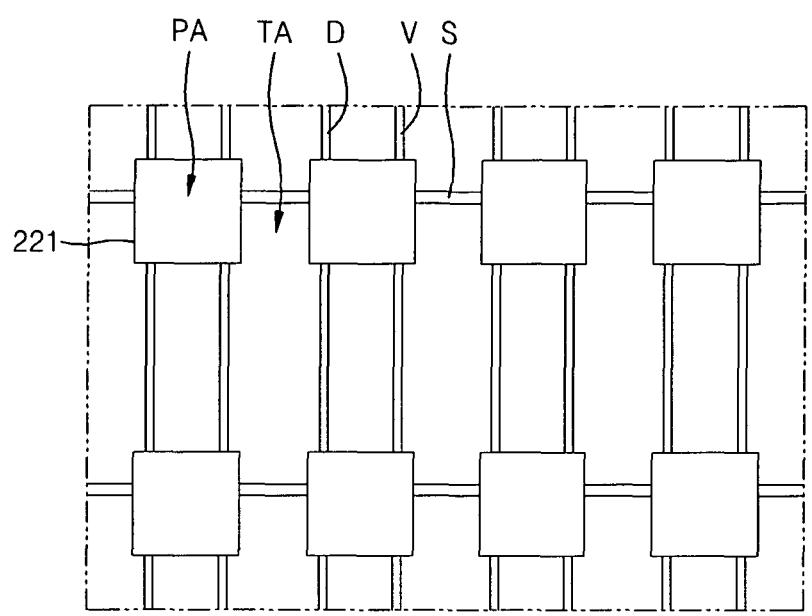
FIG. 7 is a plan view showing an example of the organic emission unit of FIG. 6.

Each of the pixel regions PA includes the pixel electrode 221 that has an area corresponding to the area of pixel regions PA. The pixel electrode 221 is electrically connected to the pixel circuit unit PC. The pixel circuit unit PC overlaps with the pixel electrode 221 so that the pixel circuit unit PC is covered by the pixel electrode 221. Also, the conductive lines including the scan line S, the data line D, and the driving power line V are disposed to cross the pixel electrode 221. According to an embodiment of the present invention, the pixel electrode 221 has an area equal to or slightly greater than that of the pixel region PA. Accordingly, as shown in FIG. 7, when the user observes the organic emission unit 21, the pixel circuit unit PC is covered by the pixel electrode 221 and a large portion of the conductive lines are also covered. Therefore, scattering of external light is greatly reduced as described above and the user sees a portion of the conductive lines through the transmitting regions TA. Accordingly, the user can observe an undistorted external image.

Figure 8:
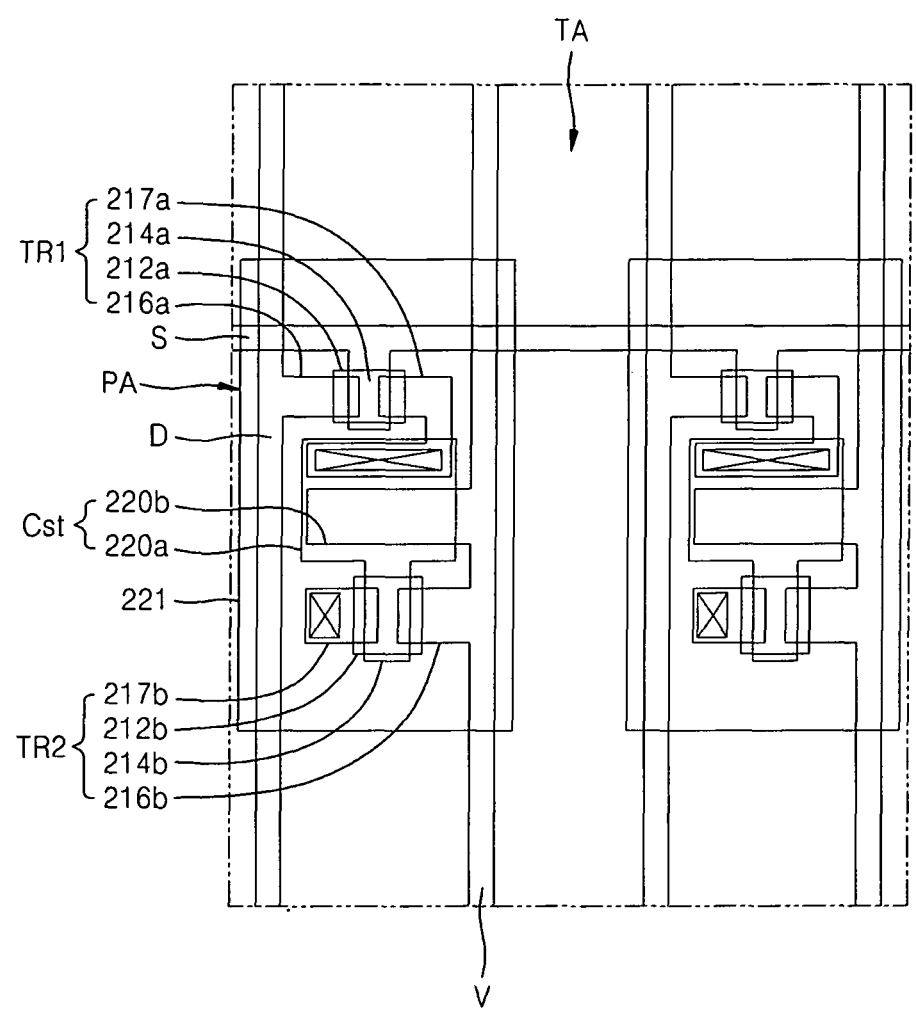
FIG. 8 is a plan view showing an example of the organic emission unit of FIG. 6.
Figure 9:
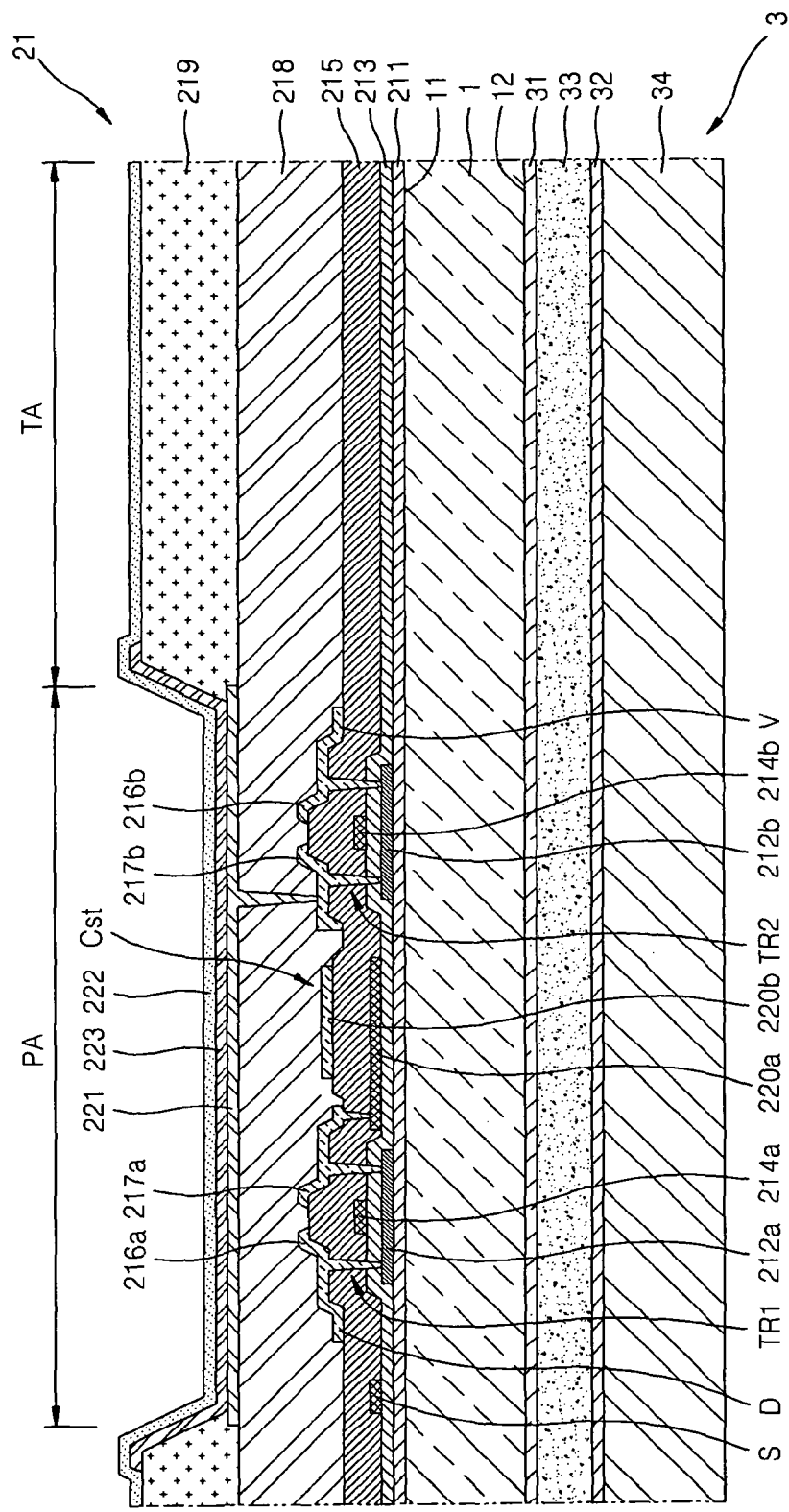
FIG. 9 is a cross-sectional view of an organic light emitting display device according to an embodiment of the present invention.

FIG. 8 is a plan view showing an example of the organic emission unit 21, and FIG. 9 is a cross-sectional view of an organic light emitting display device according to an embodiment of the present invention. According to an embodiment of the present invention, in the organic emission unit 21 of FIG. 8, a buffer layer 211 is disposed on the first surface 11 of the first substrate 1, and the first TFT TR1, a capacitor Cst, and a second TFT TR2 are disposed on the buffer layer 211.

First, a first semiconductor active layer 212a and a second semiconductor active layer 212b are formed on the buffer layer 211. The buffer layer 211 prevents impurity elements from penetrating into the organic emission unit 21 and planarizes a surface of the organic emission unit 21. The buffer layer 211 is formed of any of various materials that can perform the functions described above, such as an inorganic material such as silicon oxide, silicon nitride, silicon oxynitride, aluminum oxide, aluminum nitride, titanium oxide, or titanium nitride, an organic material such as polyimide, polyester, or acryl, or stacks of these materials. However, aspects of the present invention are not limited thereto, and the buffer layer 211 may be omitted.

The first and second semiconductor active layers 212a and 212b are formed of polycrystal silicon. However, aspects of the present invention are not limited thereto, and the first and second semiconductor active layers 212a and 212b may be formed of a semiconductor oxide, for example, a G-I—Z—O layer [a($In_2O_3$)b($Ga_2O_3$)c(ZnO) layer], where a, b, and c are integers that respectively satisfy a≥0, b≥0, and c>0. When the first and second semiconductor active layers 212a and 212b are formed of a semiconductor oxide, optical transmittance may be further increased compared to when the active layers are formed of a silicon semiconductor. A gate insulating layer 213 covering the first and second semiconductor active layers 212a and 212b is formed on the buffer layer 211. First and second gate electrodes 214a and 214b are formed on the gate insulating layer 213.

An interlayer insulating layer 215 is formed on the gate insulating layer 213 to cover the first and second gate electrodes 214a and 214b. A first source electrode 216a, a first drain electrode 217a, a second source electrode 216b and a second drain electrode 217b are each formed on the interlayer insulating layer 215. The first source electrode 216a and the first drain electrode 217a are connected to the first semiconductor active layer 212a through a contact hole. The second source electrode 216b and the second drain electrode 217b are connected to the second semiconductor active layer 212b through a contact hole.

In FIG. 9, the scan line S may be substantially simultaneously formed with the first and second gate electrodes 214a and 214b. The data line D may be substantially simultaneously formed with the first source electrode 216a and be connected to the first source electrode 216a. The driving power line V may be substantially simultaneously formed with the second source electrode 216b and be connected to the second source electrode 216b.

In the capacitor Cst, a lower electrode 220a is substantially simultaneously formed with the first and second gate electrodes 214a and 214b, and an upper electrode 220b is substantially simultaneously formed with the first drain electrode 217a. However, aspects of the present invention are not limited thereto, and the structures of the first TFT TR1, the capacitor Cst, and the second TFT TR2 may be any of various types of TFT and capacitor structures.

A passivation layer 218 is formed to cover the first TFT TR1, the capacitor Cst, and the second TFT TR2. The passivation layer 218 may be a single layer or multiple layers of insulating film. An upper surface of the passivation layer 218 is planarized. The passivation layer 218 may be formed of an inorganic material and/or an organic material.

The pixel electrode 221 covering the first TFT TR1, the capacitor Cst, and the second TFT TR2 is formed on the passivation layer 218. The pixel electrode 221 is connected to the second drain electrode 217b of the second TFT TR2 through a via hole formed in the passivation layer 218. In one embodiment, as shown in FIG. 7, the pixel electrode 221 is formed as an island type independent from each other pixel electrode 221. A pixel defining layer 219 covering edges of the pixel electrode 221 is formed on the passivation layer 218. An organic emission layer 223 and an opposite electrode 222 are sequentially formed on the pixel electrode 221. The opposite electrode 222 is formed on all of the pixel regions PA and the transmitting regions TA.

The organic emission layer 223 is a low molecular weight organic film or a polymer organic film having a large molecular weight. When the organic emission layer 223 is a low molecular weight organic film, the organic emission layer 223 is formed by stacking a hole injection layer (HIL), a hole transport layer (HTL), an emission layer (EML), an electron transport layer (ETL), and an electron injection layer (EIL) in a single structure or a composite structure, and is formed of any of various materials such as copper phthalocyanine (CuPc), N,N'-Di(naphthalene-1-yl)-N,N'-diphenyl-benzidine (NPB), or tris-8-hydroxyquinoline aluminum (Alq3). The low-molecular weight organic film is formed by vacuum deposition. In this regard, the HIL, the HTL, the ETL, and the EIL are common layers and are commonly applied to red, green, and blue pixels. Accordingly, unlike the organic emission layer in FIG. 9, the common layers are formed to cover the pixel regions PA and the transmitting regions TA like the opposite electrode 222.

In one embodiment, the pixel electrode 221 functions as an anode electrode, and the opposite electrode 222 functions as a cathode electrode. However, aspects of the present invention are not limited thereto, and the polarities of the pixel electrode 221 and the opposite electrode 222 may be reversed.

According to an embodiment of the present invention, the pixel electrode 221 is a reflection electrode and the opposite electrode 222 is a transparent electrode. The pixel electrode 221 includes a reflection film formed of Ag, Mg, Al, Pt, Pd, Au, Ni, Nd, Ir, Cr, Li, Ca, or a compound of these materials, or an oxide having a high work function such as ITO, IZO, ZnO, or $In_2O_3$. The opposite electrode 222 is formed of a metal having a low work function such as Ag, Mg, Al, Pt, Pd, Au, Ni, Nd, Ir, Cr, Li, or Ca. According to the present embodiment, the organic emission unit 21 is a top emission type in which an image is displayed towards the opposite electrode 222. However, aspects of the present invention are not limited thereto, and the organic emission unit 21 may be a bottom emission type or a dual emission type.

When the pixel electrode 221 is a reflection electrode, the pixel circuit unit PC disposed under the pixel electrode 221 is covered by the pixel electrode 221. Therefore, referring to FIG. 9, at upper outer sides of the opposite electrode 222, the user cannot observe the first TFT TR1, the capacitor Cst, and the second TFT TR2, which are disposed under the pixel electrode 221. Also, the user can not observe portions of the scan line S, the data line D, and the driving power line V. Accordingly, a more clear external image is viewable since distortion of the external image, which is due to each of the patterns that constitute the organic emission unit 21, is not generated.

However, aspects of the present invention are not limited thereto. For example, the pixel electrode 221 can also be a transparent electrode or a semi-transparent electrode. In the present embodiment, the pixel electrode 221 is formed of an oxide having a high work function, such as ITO, IZO, ZnO, or $In_2O_3$. If the pixel electrode 221 is transparent, the user can observe the first TFT TR1, the capacitor Cst, and the second TFT TR2 disposed under the pixel electrode 221, as well as portions of the scan line S, the data line D, and the driving power line V, at the upper outer sides of the opposite electrode 222. However, although the pixel electrode 221 is transparent, there is a loss of light since the transmittance of light therethrough is not 100%. Also, the transmittance of external light is further reduced due to the pixel electrode 221 since the conductive patterns are disposed in the region of the pixel electrode 221. Therefore, interference due to the conductive patterns on the external light is reduced as compared when the external light directly enters the conductive patterns. Thus, distortion of an external image is reduced.

In an embodiment of the present invention, in order to further increase the optical transmittance of the transmitting regions TA, the passivation layer 218, the gate insulating layer 213, the interlayer insulating layer 215, and the pixel defining layer 219 may be formed as transparent insulating layers. Herein, the first substrate 1 has a transmittance greater than or equal to a total transmittance of the transparent insulating layers. The passivation layer 218 is interchangeably used with a first insulating layer, and a combination of the gate insulating layer 213, the interlayer insulating layer 215, and the pixel defining layer 219 is interchangeably used with a second insulating layer.

As described above, the PDLC device 3 is formed on a second surface 12 of the first substrate 1. As shown in FIG. 9, the PDLC device 3 has an area corresponding to the entire area of the display device including the transmitting regions TA and the pixel regions PA. Accordingly, the transmission of external light that is incident from a lower side of a second substrate 34 of FIG. 9 may be selectively adjusted. That is, when the external light is intense or when the user does not want to see the external environment, the predetermined voltage is not applied to the first and second electrodes 31 and 32 as described above, and accordingly, only the image from the organic emission unit 21 may be provided to the user. When the user wants to see the external environment, the predetermined voltage is applied to the first and the second electrodes 31 and 32 so that the external light may be transmitted through the PDLC device 3.

Figure 10:
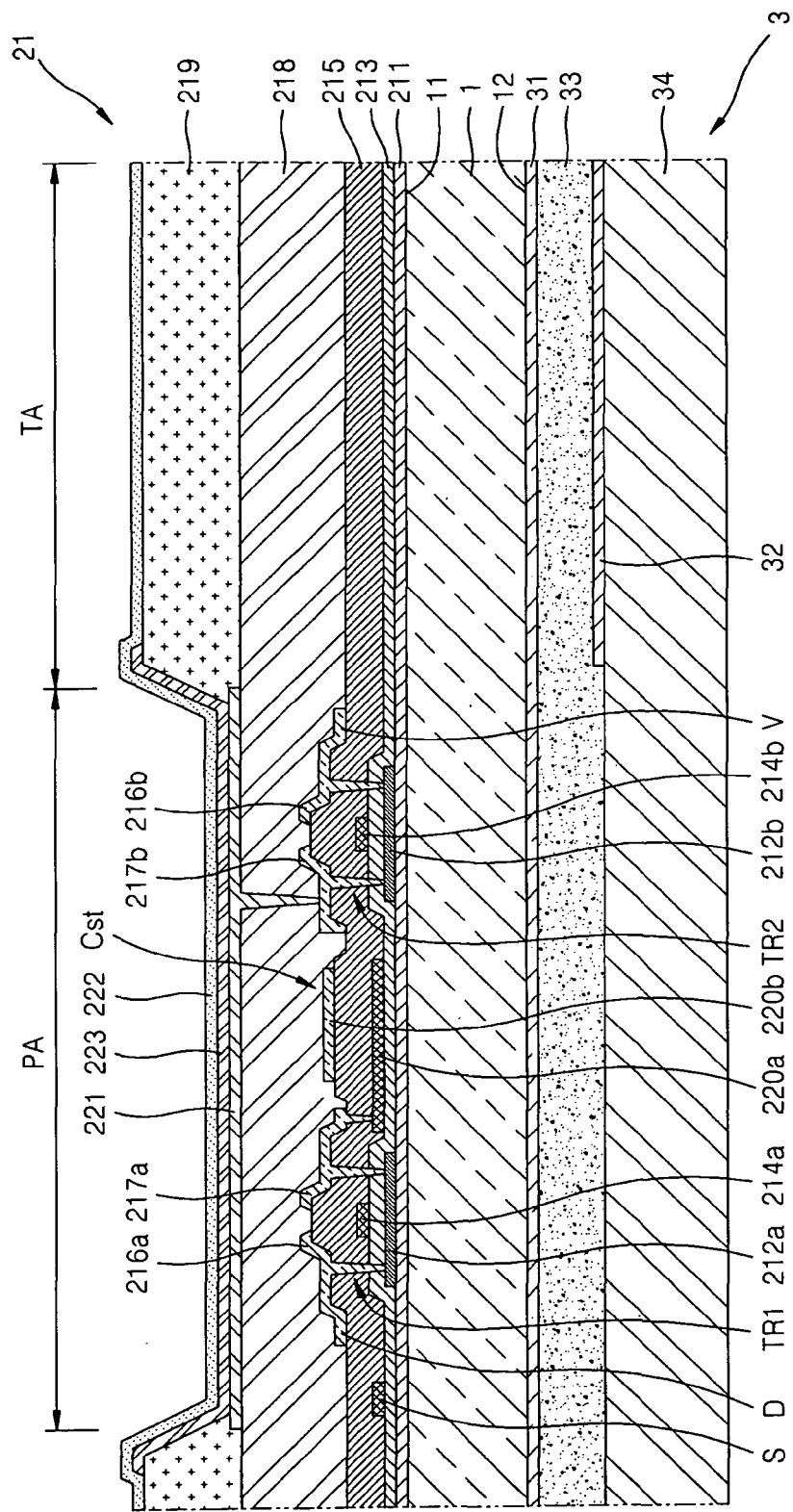
FIG. 10 is a cross-sectional view of an organic light emitting display device according to another embodiment of the present invention.

In addition, as shown in FIG. 10, at least one of the first and second electrodes 31 and 32 in the PDLC device 3 is formed to have a pattern corresponding to at least a part of the transmitting regions TA while disposed under the transmitting regions TA. For example, as shown in FIG. 10, the second electrode 32 is formed on a portion of the second substrate 34 corresponding to at least a part of the transmitting region TA. In addition, the second electrode 32 is formed to have an area that is equal to an area of at least a part of the transmitting region TA. The second electrode 32 is patterned as an island and independently exists at a position corresponding to each of the pixels. In addition, the first electrode 31 is a common electrode that is formed throughout the entire display regions. It is understood that the first electrode 31 could also be patterned in addition to or instead of the second electrode 32.

In the above case, the controller 4 adjusts a time of applying the predetermined voltage to the second electrode 32 with respect to a time of emitting light at the pixel regions PA. That is, the controller 4 controls the predetermined voltage to be not applied to the second electrode 32 when the pixel region PA emits the light. Thus, the controller 4 automatically controls the transmission of external light. Therefore, images which are clear and have a high contrast ratio are visible to the user. Moreover, when the second electrode 32 is patterned as shown in FIG. 10, the PDLC device 3 may be controlled according to the pixel unit, and thus, the user may see clear images while observing the external environment.

Figure 11:
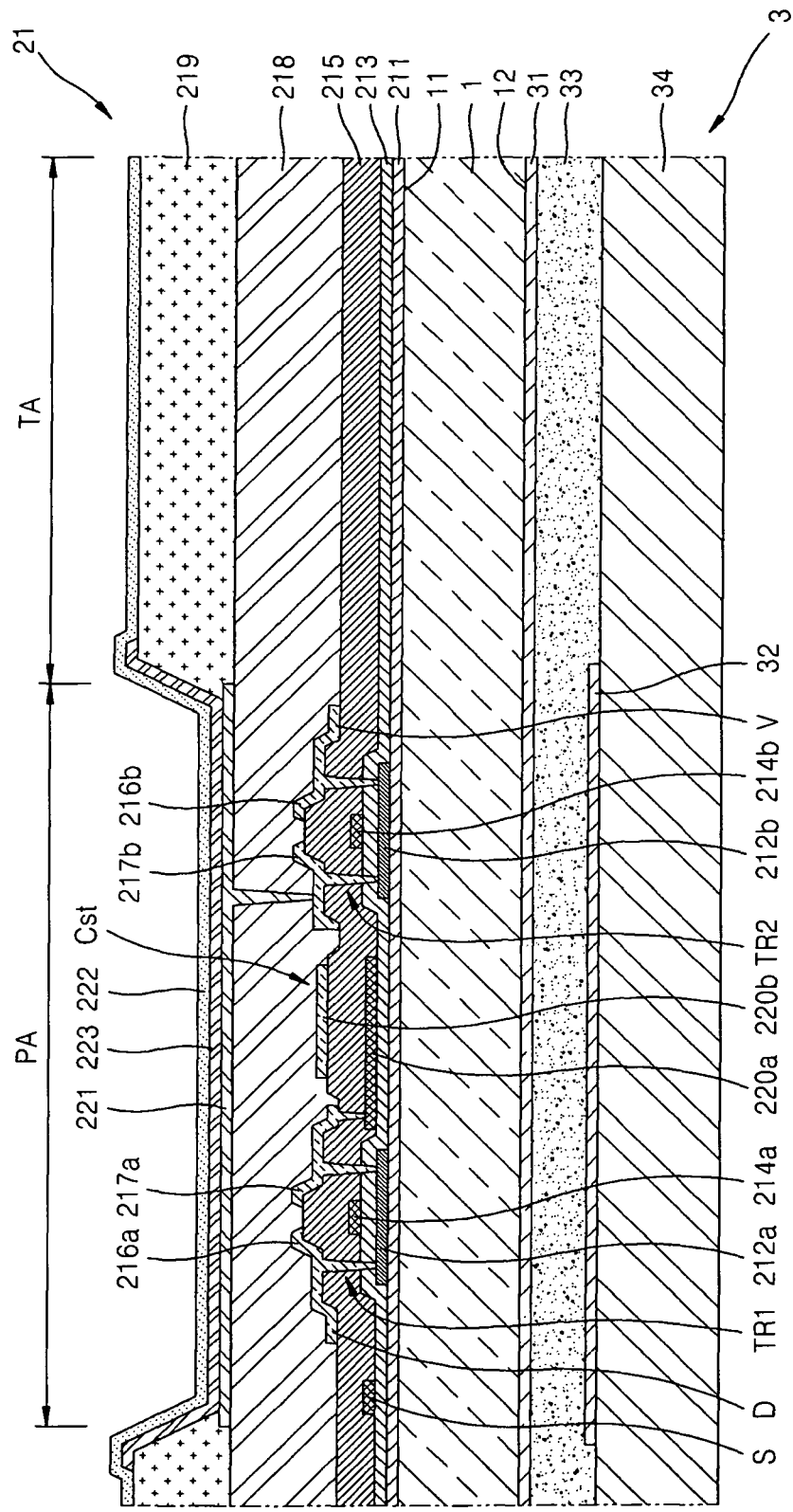
FIG. 11 is a cross-sectional view of an organic light emitting display device according to an embodiment of the present invention.

In addition, as shown in FIG. 11, at least one of the first and second electrodes 31 and 32 in the PDLC device 3, for example, the second electrode 32, is formed to have a pattern corresponding to the pixel region PA under the pixel region PA. In the present embodiment, the controller 4 operates the PDLC device 3 when each of the pixel regions PA displays the image in order to restrict the transmittance of the external light. Then, the incidence of the external light to the pixel regions PA may be reduced, and a degradation of the brightness and the color purity at the pixel regions PA may be reduced.

In more detail, the PDLC device 3 is disposed on a position corresponding to each of the pixel regions PA to operate in communication with the operation of the each pixel region PA. For example, as shown in FIG. 11, the second electrode 32 formed on the second substrate 34 is formed to correspond to each of the pixel regions PA. In addition, the second electrode 32 is formed to have an area that is greater than that of the pixel electrode 221. The second electrode 32 is patterned as an island to independently correspond to each of the pixel regions PA. Meanwhile, the first electrode 31 is a common electrode that is formed throughout the entire display regions.

In the present embodiment, when a constant voltage is applied to the first electrode 31 and the second electrode 32 is driven opposite to the driving of the pixel electrode 221, the PDLC layer 33, which is disposed on a certain second electrode 32, restricts the transmission of the external light. The transmission of the external light is restricted when the pixel region PA corresponding to the above second electrode 32 emits the light, and thus, the external light incident on the corresponding pixel region PA may be restricted. Therefore, the external light incident on the pixel regions PA may be reduced, and accordingly, reducing degradation of the brightness and color purity, wherein the degradation is caused by mixture of the light emitted from the pixel regions PA with the external light. Moreover, when the second electrode 32 is patterned as shown in FIG. 10, the PDLC layer 33 independently operates at each of the pixel regions PA, and thus, the PDLC device 3 may be controlled according to the pixel unit. Thus, the user may see clear images while observing the external environment. In embodiments shown in FIGS. 10 and 11, the first electrode 31 is patterned instead of patterning the second electrode 32.

Figure 12:
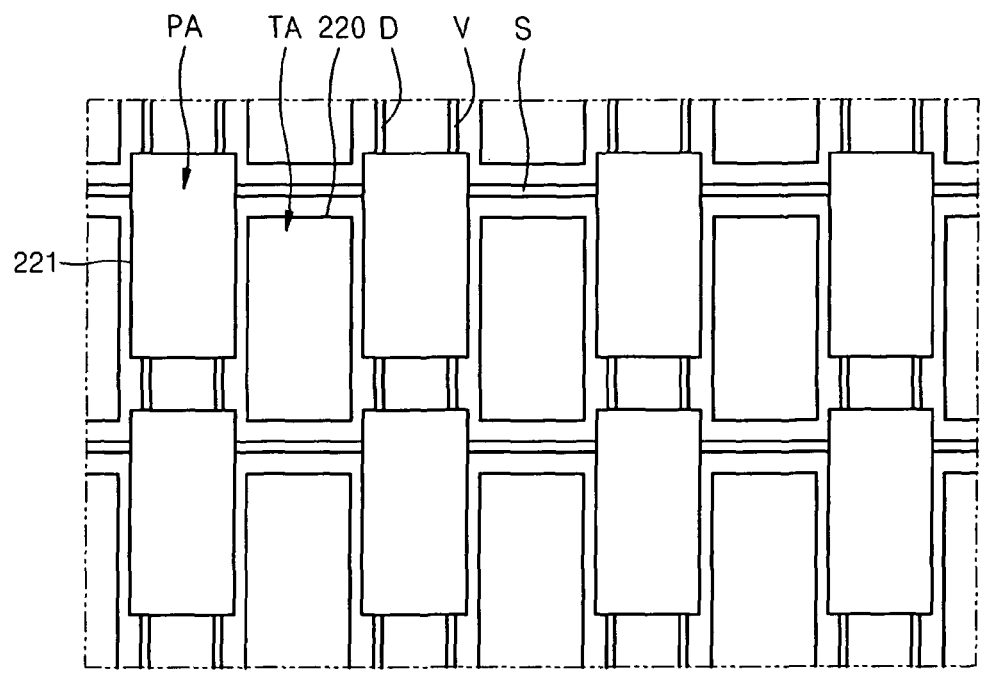
FIG. 12 is a plan view showing an example of the organic emission unit of FIG. 6.

FIGS. 12 and 13 show another example of the organic emission unit 21 and the organic light emitting display device, and an opening 220 having a predetermined shape and formed in the transparent insulating films in the transmitting regions TA. The opening 220 is formed as wide as possible as long as the opening 220 does not interrupt the scan line S, the data line D, and the driving power line V. The opening 220 is formed in the gate insulating layer 213, the interlayer insulating layer 215, the passivation layer 218, and the pixel defining layer 219. In FIG. 12, the opening 220 is not formed in the buffer layer 211 in order to prevent impurities from penetrating into the first substrate 1. If necessary, the opening 220 may extend to the buffer layer 211. In this way, the formation of the opening 220 in the transmitting regions TA further increases the optical transmittance of the transmitting regions TA, and thus, an external image can be further clearly observed by the user.

As described above, according to the PDLC device 3 according to aspects of the present invention, a color reproduction ratio and a contrast ratio may be improved. The organic light emitting display device, according to aspects of the present invention may be used as a functional window, such as might be used in heads-up displays in aircraft and cars, advertisements in store windows, displays in homes, or other similar applications using the functional window. According to aspects of the present invention, an organic light emitting display device may prevent distortion of a transmitted image by eliminating light scattering during image display. According to aspects of the present invention, the transmission of external light through the organic light emitting display device may be controlled automatically or whenever the user wants to. In addition, degradation of the brightness and color coordinate reproduction due to the external light transmitted during the image display may be reduced, and a range of the color reproduction ratio may be increased. Also, the contrast ratio of the images may be improved.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic light emitting display device comprising:
    a substrate having a transmitting region and pixel regions, adjacent pairs of the pixel regions being separated from each other by a corresponding portion of the transmitting region interposed between the pixel regions;
    thin film transistors formed on a first surface of the substrate in respective ones of the pixel regions;
    a passivation layer covering the thin film transistors;
    pixel electrodes disposed on the passivation layer;
    an opposite electrode disposed to face the pixel electrodes and configured to transmit light;
    an organic emission layer disposed between the pixel electrodes and the opposite electrode and configured to emit light; and
    a polymer dispersed liquid crystal (PDLC) device disposed such that the thin film transistors are between the PDLC device and the passivation layer and disposed in an area corresponding to the transmitting region, the PDLC device comprising:
        a first electrode;
        a second electrode; and
        a PDLC layer having liquid crystal dispersed in a polymer matrix,
    wherein voltages of different polarities are applied to the first electrode and the second electrode, respectively, to form an electric field,
    wherein the PDLC device is insulated from the thin film transistors,
    wherein each of the pixel electrodes are electrically connected to and formed substantially directly above a corresponding one of the thin film transistors, and
    wherein each of the pixel electrodes is formed only in the corresponding pixel region,
    wherein the pixel electrodes are separated from each other, and
    wherein the second electrode is formed as a pattern to correspond to the transmitting region and not to correspond to the pixel regions.

2. The organic light emitting display device of claim 1, wherein at least one of the first electrode and/or the second electrode comprise a transparent material.

3. The organic light emitting display device of claim 1, wherein each of the pixel electrodes has an area substantially identical to that of a corresponding one of the pixel regions.

4. The organic light emitting display device of claim 1, further comprising a plurality of conductive lines formed in each of the pixel regions and electrically connected to the corresponding thin film transistor, wherein all of the conductive lines are disposed substantially between the corresponding pixel electrode and the substrate.

5. The organic light emitting display device of claim 1, wherein a ratio of a total area of the transmitting region with respect to a combined area of the pixel regions and the transmitting region is between about 20% and about 90%.

6. The organic light emitting display device of claim 1, wherein the passivation layer is formed on both the transmitting region and the pixel regions and is formed of a transparent material.

7. The organic light emitting display device of claim 6, wherein the substrate has a transmittance greater than or equal to that of the passivation layer.

8. The organic light emitting display device of claim 1, wherein the PDLC device is formed between the first surface of the substrate and the thin film transistor.

9. The organic light emitting display device of claim 1, wherein the PDLC device is formed on a second surface of the substrate facing the first surface of the substrate.

10. An organic light emitting display device comprising:
    a substrate having a transmitting region and pixel regions, adjacent pairs of the pixel regions being separated from each other by a corresponding portion of the transmitting region interposed between the pixel regions;
    pixel circuit units disposed in respective ones of the pixel regions over a first surface of the substrate, wherein each of the pixel circuit units comprises at least one thin film transistor;
    a first insulating film covering the pixel circuit unit;
    pixel electrodes disposed on the first insulating film;
    an opposite electrode disposed to face the pixel electrodes and configured to transmit light;
    an organic emission layer disposed between the pixel electrodes and the opposite electrode and configured to emit light; and
    a polymer dispersed liquid crystal (PDLC) device disposed such that the thin film transistor is between the PDLC device and the first insulating film and disposed in an area corresponding to at least the transmitting region, the PDLC device comprising:

a first electrode;
a second electrode; and
a PDLC layer in which liquid crystal is dispersed in polymer matrix,
wherein voltages of different polarities are applied to the first electrode and the second electrode, respectively, to form an electric field, wherein the PDLC device is insulated from the thin film transistor, wherein each of the pixel electrodes is electrically connected to and formed substantially directly above the corresponding pixel circuit unit, wherein the pixel electrodes are separated from each other and formed only in the pixel regions, and wherein the second electrode is formed as a pattern to correspond to the transmitting region and not to correspond to the pixel regions.

11. The organic light emitting display device of claim 10, wherein at least one of the first electrode and/or the second electrode comprise a transparent material.

12. The organic light emitting display device of claim 10, wherein each of the pixel electrodes has an area substantially identical to that of one of the pixel regions.

13. The organic light emitting display device of claim 10, further comprising conductive lines formed in each of the pixel regions and electrically connected to the corresponding pixel circuit unit, wherein the conductive lines are formed substantially between the corresponding pixel electrode and the substrate.

14. The organic light emitting display device of claim 10, wherein a ratio of a total area of the transmitting region with respect to a combined area of the pixel regions and the transmitting region is between about 20% and about 90%.

15. The organic light emitting display device of claim 10, wherein the transmitting region and the pixel regions each comprise:
the first insulating film; and
second insulating films,
wherein the first insulating film and the second insulating films are formed of a transparent material.

16. The organic light emitting display device of claim 15, wherein the substrate has a transmittance greater than or equal to a total transmittance of the first insulating film and the second insulating films.

17. The organic light emitting display device of claim 10, wherein the PDLC device is formed between the first surface of the substrate and the thin film transistor.

18. The organic light emitting display device of claim 10, wherein the PDLC device is formed on a second surface of the substrate facing the first surface of the substrate.

19. An organic light emitting display device, comprising:
a substrate having a transmitting region and pixel regions, adjacent pairs of the pixel regions being separated from each other by a corresponding portion of the transmitting region interposed between the pixel regions;
thin film transistors formed on a first surface of the substrate in respective ones of the pixel regions;
a passivation layer covering the thin film transistors;
pixel electrodes disposed on the passivation layer;
an opposite electrode disposed to face the pixel electrodes and configured to transmit light;
an organic emission layer disposed between the pixel electrodes and the opposite electrode and configured to emit light; and
a polymer dispersed liquid crystal (PDLC) device disposed such that the thin film transistors are between the PDLC device and the passivation layer and disposed in an area corresponding to the transmitting region, the PDLC device comprising:
a first electrode;
a second electrode; and
a PDLC layer having liquid crystal dispersed in a polymer matrix,
wherein voltages of different polarities are applied to the first electrode and the second electrode, respectively, to form an electric field,
wherein the PDLC device is insulated from the thin film transistors.,
wherein each of the pixel electrodes are electrically connected to and formed substantially directly above a corresponding one of the thin film transistors,
wherein each of the pixel electrodes is formed only in the corresponding pixel region, and wherein the pixel electrodes are separated from each other, and
wherein the second electrode is formed as an island to independently correspond to each one of a respective ones of the pixel regions.

20. An organic light emitting display, comprising:
a substrate having a transmitting region and pixel regions, adjacent pairs of the pixel regions being separated from each other by a corresponding portion of the transmitting region interposed between the pixel regions;
pixel circuit units disposed in respective ones of the pixel regions over a first surface of the substrate, wherein each of the pixel circuit units comprises at least one thin film transistor;
a first insulating film covering the pixel circuit unit;
pixel electrodes disposed on the first insulating film;
an opposite electrode disposed to face the pixel electrodes and configured to transmit light;
an organic emission layer disposed between the pixel electrodes and the opposite electrode and configured to emit light; and
a polymer dispersed liquid crystal (PDLC) device disposed such that the thin film transistor is between the PDLC device and the first insulating film and disposed in an area corresponding to at least the transmitting region, the PDLC device comprising:
a first electrode;
a second electrode; and
a PDLC layer in which liquid crystal is dispersed in polymer matrix,
wherein voltages of different polarities are applied to the first electrode and the second electrode, respectively, to form an electric field, wherein the PDLC device is insulated from the thin film transistor, wherein each of the pixel electrodes is electrically connected to and formed substantially directly above the corresponding pixel circuit unit wherein the pixel electrodes are separated from each other and formed only in the pixel regions, and wherein the second electrode is formed as an island to independently correspond to each one of a respective ones of the pixel regions.

* * * * *

UNITED STATES PATENT AND TRADEMARK OFFICE
CERTIFICATE OF CORRECTION

PATENT NO. : 8,625,055 B2  
APPLICATION NO. : 13/064561  
DATED : January 7, 2014  
INVENTOR(S) : Hyung-Jun Song et al.

Page 1 of 1

It is certified that error appears in the above-identified patent and that said Letters Patent is hereby corrected as shown below:

TITLE PAGE: ITEM 75

Please correct the inventors to read:

(75) Inventors:

Hyung-Jun Song, Yongin (KR);  
    Jong-Hyuk Lee, Yongin (KR);  
    Chang-Ho Lee, Yongin (KR);  
    Il-Soo Oh, Yongin (KR);  
  --Hee-Joo Ko, Yongin (KR)--;  
  --Se-Jin Cho, Yongin (KR)--;  
    Jin-Young Yun, Yongin (KR)

Signed and Sealed this  
Twenty-third Day of December, 2014

Michelle K. Lee  
*Deputy Director of the United States Patent and Trademark Office*